United States Patent
You

(10) Patent No.: US 11,791,007 B2
(45) Date of Patent: Oct. 17, 2023

(54) LEAKAGE DETECTION CIRCUIT, NONVOLATILE MEMORY DEVICE INCLUDING LEAKAGE DETECTION CIRCUIT, AND MEMORY SYSTEM INCLUDING NONVOLATILE MEMORY DEVICE

(71) Applicant: SK hynix Inc., Icheon-si (KR)

(72) Inventor: Byoung Sung You, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 30 days.

(21) Appl. No.: 17/576,480

(22) Filed: Jan. 14, 2022

(65) Prior Publication Data

US 2023/0060971 A1    Mar. 2, 2023

(30) Foreign Application Priority Data

Sep. 2, 2021  (KR) .................. 10-2021-0117179

(51) Int. Cl.
*G11C 29/02*        (2006.01)
*G11C 29/50*        (2006.01)

(52) U.S. Cl.
CPC ............ *G11C 29/025* (2013.01); *G11C 29/50* (2013.01); *G11C 2029/5004* (2013.01); *G11C 2029/5006* (2013.01)

(58) Field of Classification Search
CPC .................. G11C 29/025; G11C 29/50; G11C 2029/5004; G11C 2029/5006
See application file for complete search history.

(56) References Cited

U.S. PATENT DOCUMENTS

| | | | |
|---|---|---|---|
| 10,714,205 B1 * | 7/2020 | Fang | G11C 29/025 |
| 10,886,003 B2 * | 1/2021 | Lee | G11C 16/30 |
| 2016/0351274 A1 * | 12/2016 | Pan | G11C 29/50 |

FOREIGN PATENT DOCUMENTS

| | | |
|---|---|---|
| KR | 1020130140601 A | 12/2013 |
| KR | 1020180110708 A | 10/2018 |
| KR | 1020190121973 A | 10/2019 |
| KR | 1020200001420 A | 1/2020 |
| KR | 1020200067035 A | 6/2020 |

* cited by examiner

*Primary Examiner* — Mohammed A Bashar
(74) *Attorney, Agent, or Firm* — WILLIAM PARK & ASSOCIATES LTD.

(57) ABSTRACT

A leakage detection circuit may include: a comparison circuit configured to compare an input voltage, which changes based on the level of an operation voltage node, to a reference voltage and configured to output a detection signal; and a state decision circuit configured to determine a count value that corresponds to a determination period based on the detection signal and configured to output leakage state information based on the count value.

19 Claims, 11 Drawing Sheets

LEAKAGE DETECTION CIRCUIT, NONVOLATILE MEMORY DEVICE INCLUDING LEAKAGE DETECTION CIRCUIT, AND MEMORY SYSTEM INCLUDING NONVOLATILE MEMORY DEVICE

CROSS-REFERENCES TO RELATED APPLICATION

The present application claims priority under 35 U.S.C. § 119(a) to Korean application number 10-2021-0117179, filed on Sep. 2, 2021, in the Korean Intellectual Property Office, which is incorporated herein by reference in its entirety.

BACKGROUND

1. Technical Field

Various embodiments generally relate to a memory system, and more particularly, to a memory system including a nonvolatile memory device.

2. Related Art

The present disclosure relates to a leakage detection circuit which detects the degree of current leakage in a nonvolatile memory device.

An electronic device may include a number of electronic components. Among the electronic devices, a computer system may include a number of electronic components constituted by semiconductors. Among the semiconductor devices constituting the computer system, a host such as a processor or memory controller may perform data communication with a memory device. The memory device may include a plurality of memory cells which can be specified by word lines and bit lines, in order to store data.

SUMMARY

In an embodiment, a leakage detection circuit may include: a comparison circuit configured to compare an input voltage, which changes based on the level of an operation voltage node, to a reference voltage and configured to output a detection signal; and a state decision circuit configured to determine a count value that corresponds to a determination period based on the detection signal and configured to output leakage state information based on the count value.

In an embodiment, a nonvolatile memory device may include: a voltage supply circuit configured to supply an operation voltage while an internal operation is being performed; a leakage detection circuit configured to perform a leakage detection operation that detects current leakage from a voltage transfer path of the operation voltage; and a control circuit configured to control the leakage detection operation.

In an embodiment, a memory system may include: a nonvolatile memory device configured to perform a leakage detection operation while performing an internal operation on a target memory block; and a controller configured to perform a memory management operation on the target memory block based on a performance result of the leakage detection operation.

DETAILED DESCRIPTION

Figure 1:
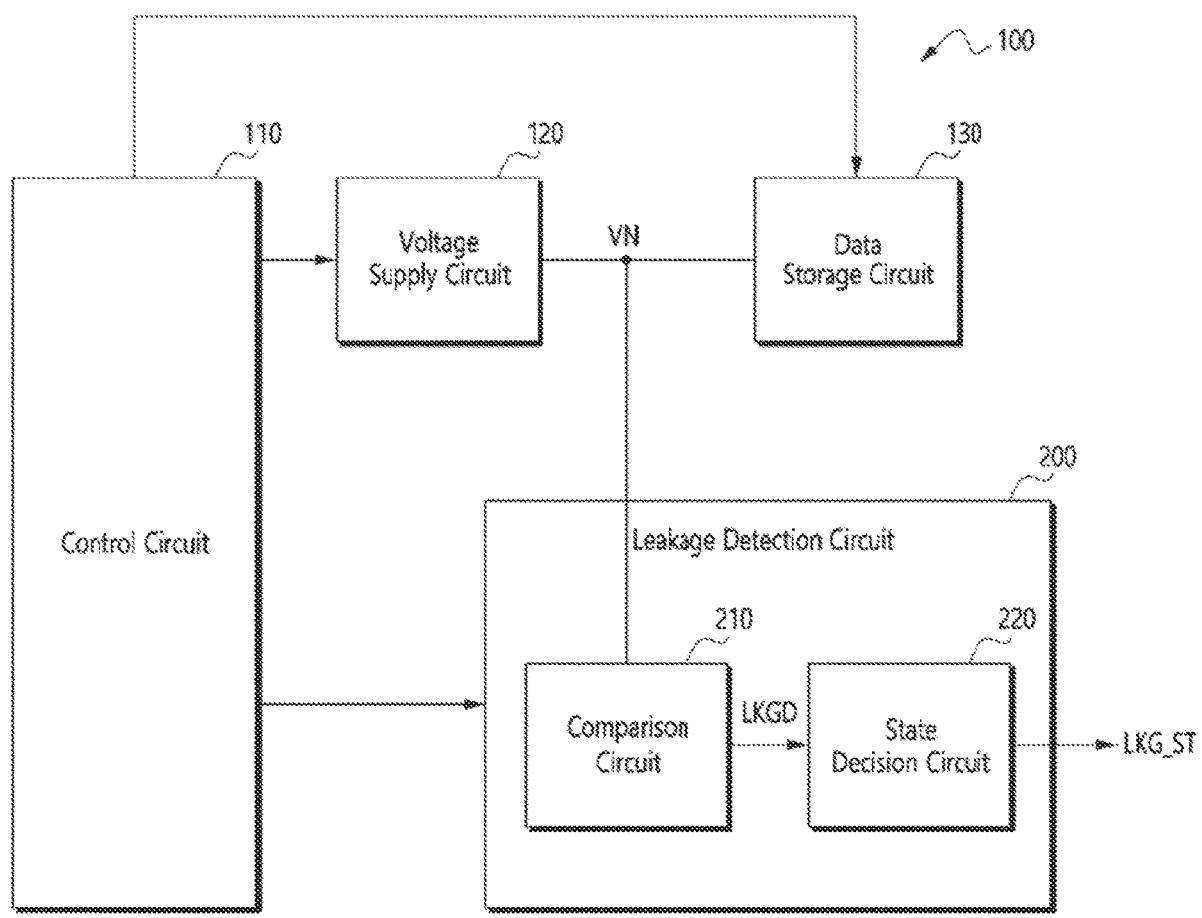
FIG. 1 is a block diagram illustrating a nonvolatile memory device in accordance with an embodiment.

The advantages and characteristics of the present disclosure and a method for achieving the advantages and characteristics will be described through the following embodiments with reference to the accompanying drawings. However, the present disclosure is not limited to the embodiments described herein, but may be embodied in different manners. The present embodiments are only provided to describe the present disclosure in detail, such that the technical idea of the present disclosure can be easily carried out by those skilled in the art to which the present disclosure pertains.

The present embodiments are not limited to specific shapes illustrated in the drawings, but may be exaggerated for clarity. In this specification, specific terms are used. However, the terms are only used to describe the present disclosure, and do not limit the scope of the present disclosure, described in claims.

In this specification, an expression such as 'and/or' may indicate including one or more of components listed before/after the expression. Moreover, an expression such as 'connected/coupled' may indicate that one element is directly connected/coupled to another element or indirectly connected/coupled to another element through still another element. The terms of a singular form may include plural forms unless referred to the contrary. Furthermore, the meanings of 'include' and 'comprise' or 'including' and 'comprising' may specify a component, step, operation and element, and do not exclude the presence or addition of one or more other components, steps, operations and elements.

Various embodiments are directed to a leakage detection circuit, which determines the degree of current leakage through a leakage detection operation, and a nonvolatile memory device including the same.

Also, various embodiments are directed to a memory system, which performs a memory management operation on a nonvolatile memory device according to a performance result of a leakage detection operation, thereby guaranteeing data reliability.

In accordance with the present embodiments, the leakage detection circuit and the nonvolatile memory device including the same may determine the degree of current leakage through a leakage detection operation.

Furthermore, the memory system may perform the memory management operation on the nonvolatile memory device according to a performance result of a leakage detection operation, thereby guaranteeing data reliability.

Hereafter, embodiments will be described in detail with reference to the drawings.

FIG. 1 is a block diagram illustrating a nonvolatile memory device 100 in accordance with an embodiment.

Referring to FIG. 1, the nonvolatile memory device 100 may include a control circuit 110, a voltage supply circuit 120, a data storage circuit 130 and a leakage detection circuit 200.

The control circuit 110 may control the overall operations of the nonvolatile memory device 100 based on an external controller. The control circuit 110 may control an internal operation of the nonvolatile memory device 100, e.g. a read operation, program operation, or erase operation, based on the controller. While the internal operation is being performed based on the controller, the control circuit 110 may control the operations of the voltage supply circuit 120, the data storage circuit 130, and the leakage detection circuit 200.

The control circuit 110 may control the leakage detection circuit 200 to perform a leakage detection operation based on the controller. Based on the controller, the control circuit 110 may store setting values for the leakage detection operation and control the leakage detection circuit 200 to perform a leakage detection operation according to the setting values. Based on the controller, the control circuit 110 may determine the type of an operation voltage to which the leakage detection operation is to be performed. The type of the operation voltage may be at least one of a read voltage, a program voltage, a program verify voltage, an erase voltage, and an erase verify voltage. The control circuit 110 may output leakage state information LKG_ST as the performance result of the leakage detection operation to the controller based on the controller.

While an internal operation is being performed based on the control circuit 110, the voltage supply circuit 120 may supply various operation voltages to an operation voltage node VN. The operation voltage may include, for example, one or more read voltages, one or more program voltages, one or more program verify voltages, one or more erase voltages, and one or more erase verify voltages.

While an internal operation is being performed based on the control circuit 110, the data storage circuit 130 may receive the operation voltage from the operation voltage node VN and perform sub operations that are related to the internal operation based on the operation voltage. For example, the data storage circuit 130 may include memory cells, and the data storage circuit 130 may perform sub operations for storing data in the memory cells during a program operation and sub operations for reading data from the memory cells during a read operation.

The leakage detection circuit 200 may perform a leakage detection operation on the operation voltage of the operation voltage node VN based on the control circuit 110. The leakage detection circuit 200 may perform the leakage detection operation to detect current leakage from a voltage transfer path of the operation voltage that is included in the data storage circuit 130.

The leakage detection circuit 200 may include a comparison circuit 210 and a state decision circuit 220. The comparison circuit 210 may compare an input voltage, which changes based on the level of the operation voltage node VN, to a reference voltage and may output a detection signal LKGD. The state decision circuit 220 may determine a count value that corresponds to a determination period based on the detection signal LKGD of the comparison circuit 210 and may output the leakage state information LKG_ST based on the count value. The leakage state information LKG_ST may correspond to any one of three states, for example, "safe", "risky" and "dangerous" states, and the leakage state information LKG_ST may indicate the state of a target memory block in which an internal operation is performed.

In an embodiment, the comparison circuit 210 may output the detection signal LKGD that has a first logic level in the determination period and has a second logic level in the rest of the periods. The determination period may start when the supply of the operation voltage to the operation voltage node VN is removed. In other words, the determination period may start when the voltage supply circuit 120 that has supplied the operation voltage to the operation voltage node VD is turned off.

Figure 2:
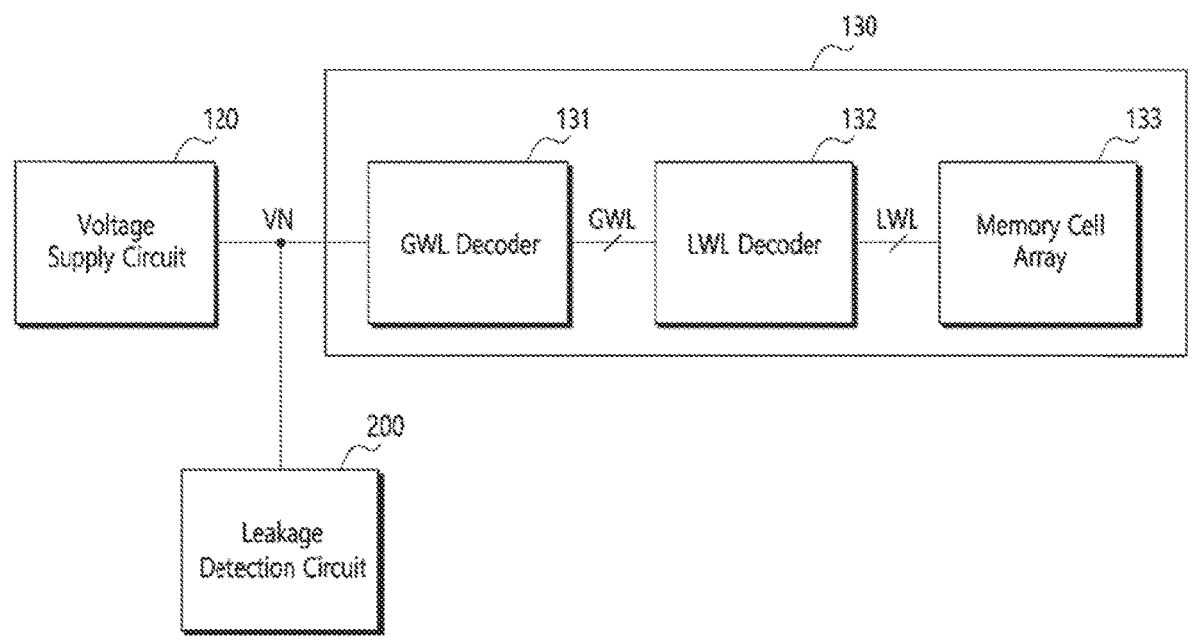
FIG. 2 is a block diagram illustrating a detailed configuration of a data storage circuit of FIG. 1 in accordance with an embodiment.

FIG. 2 is a block diagram illustrating a detailed configuration of the data storage circuit 130 of FIG. 1 in accordance with an embodiment.

Referring to FIG. 2, the data storage circuit 130 may include a global word line decoder 131, a local word line decoder 132 and a memory cell array 133.

The global word line decoder 131 may selectively couple the operation voltage node VN to global word lines GWL based on the control circuit 110. Specifically, the global word line decoder 131 may selectively couple the operation voltage node VN to one or more global word lines, selected among the global word lines GWL, based on the control circuit 110.

The local word line decoder 132 may selectively couple the global word lines GWL to local word lines LWL based on the control circuit 110. Specifically, the local word line decoder 132 may couple one or more selected global word lines to one or more local word lines, selected among the local word lines LWL, based on the control circuit 110.

The memory cell array 133 may include a plurality of memory cells. Each of the memory cells may be coupled to the corresponding local word line and may be accessed as the corresponding local word line is driven.

When the internal operation of the nonvolatile memory device 100, e.g. a program operation, is performed, the voltage supply circuit 120 may supply an operation voltage, e.g. a program voltage, to the operation voltage node VN. The program voltage that is applied to the operation voltage node VN may be applied to one or more selected memory cells through one or more selected global word lines and one or more selected local word lines by the global word line decoder 131 and the local word line decoder 132. The one or more selected memory cells may be programmed by the program voltage. That is, the program voltage may be transferred to the one or more selected memory cells from the operation voltage node VN through the voltage transfer path. The voltage transfer path of the program voltage may include a selected global word line and/or a selected local word line.

At this time, current leakage may occur from the voltage transfer path of the program voltage due to various reasons. On reason, for example, may be the wear levels of circuit elements. The current leakage may be severe with the rise in the operation count of the nonvolatile memory device 100, such as an erase count, program count, or read count. That is, the current leakage may become severe as the nonvolatile memory device 100 is used and worn more and more. The severe current leakage may cause the program voltage not to be normally transferred to a memory cell. In this case, a program fail may occur, or the reliability of data may be degraded even though no program fail occurs. Furthermore, the increase of the current leakage during a read operation may cause an uncorrectable error.

Therefore, as will be described below, based on the control circuit 110, the leakage detection circuit 200 may detect the level of the operation voltage node VN while an internal operation is being performed and detect current leakage from the voltage transfer path of the operation voltage.

Figure 3:
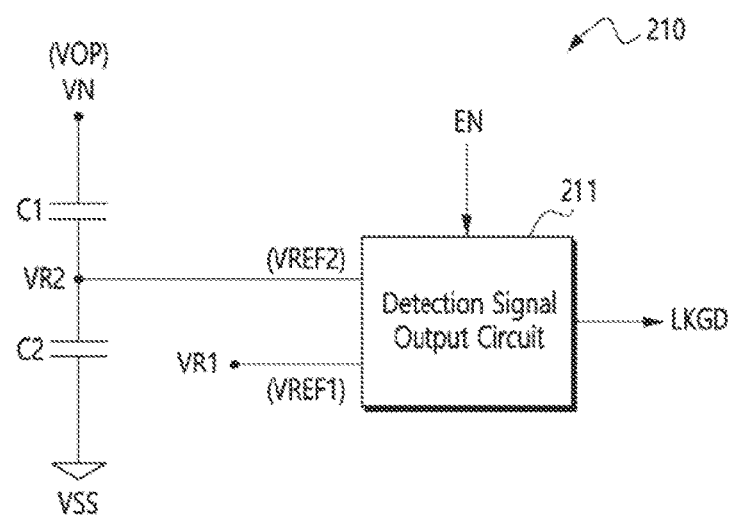
FIG. 3 is a block diagram illustrating a detailed configuration of a comparison circuit of FIG. 1 in accordance with an embodiment.

FIG. 3 is a block diagram illustrating a detailed configuration of the comparison circuit 210 of FIG. 1 in accordance with an embodiment.

Referring to FIG. 3, the comparison circuit 210 may include a first capacitor C1, a second capacitor C2, and a detection signal output circuit 211. The first capacitor C1 may be coupled between the operation voltage node VN and an input node VR2. The second capacitor C2 may be coupled between a ground node VSS and the input node VR2. When the first and second capacitors C1 and C2 both have a small capacity, the level of an input voltage VREF2 of the input node VR2 may change to a level that is similar to the level of the operation voltage node VN. The detection signal output circuit 211 may be coupled to the input node VR2 and a reference node VR1. Based on the control circuit 110, the detection signal output circuit 211 may compare the input voltage VREF2 of the input node VR2 and the reference voltage VREF1 of the reference node VR1 and may output the detection signal LKGD. In an embodiment, the detection signal output circuit 211 may include an OP amp.

The detection signal output circuit 211 may output the detection signal LKGD that has a first logic level (e.g. logic high level) in the determination period and has a second logic level (e.g. logic low level) in the other periods. In other words, the detection signal output circuit 211 may output the detection signal LKGD that has the second logic level before the determination period starts, has the first logic level in the determination period, and has the second logic level when the determination period ends.

The determination period may start when the voltage supply circuit 120 supplies an operation voltage VOP to the operation voltage node VN to charge the voltage transfer path of the operation voltage VOP with the operation voltage VOP and is then turned off. Therefore, at the start of the determination period, the operation voltage VOP and the input voltage VREF2 may be higher than the reference voltage VREF1. The control circuit 110 may transmit an enable signal EN to the detection signal output circuit 211, the enable signal EN notifying the start of the determination period. The detection signal output circuit 211 may output the detection signal LKGD based on the enable signal EN that notifies the start of the determination period. In an embodiment, the enable signal EN may be output from the voltage supply circuit 120.

The detection signal output circuit 211 may change the detection signal LKGD from the second logic level to the first logic level when the determination period starts and may determine whether the input voltage VREF2 becomes lower than the reference voltage VREF1. The detection signal output circuit 211 may change the detection signal LKGD from the first logic level to the second logic level when the input voltage VREF2 becomes lower than the reference voltage VREF1.

The first and second capacitors C1 and C2 may be coupled to the input node VR2 in order to remove noise. In an embodiment, the comparison circuit 210 might not include the first and second capacitors C1 and C2, and the input node VR2 of the detection signal output circuit 211 may be directly coupled to the operation voltage node VN.

In an embodiment, the reference voltage VREF1 may differ depending on the type of the operation voltage VOP when the leakage detection operation is performed. For example, the reference voltage VREF1, when the operation voltage VOP is the program voltage, may be different from the reference voltage VREF1, when the operation voltage VOP is the program verify voltage.

Figure 4:
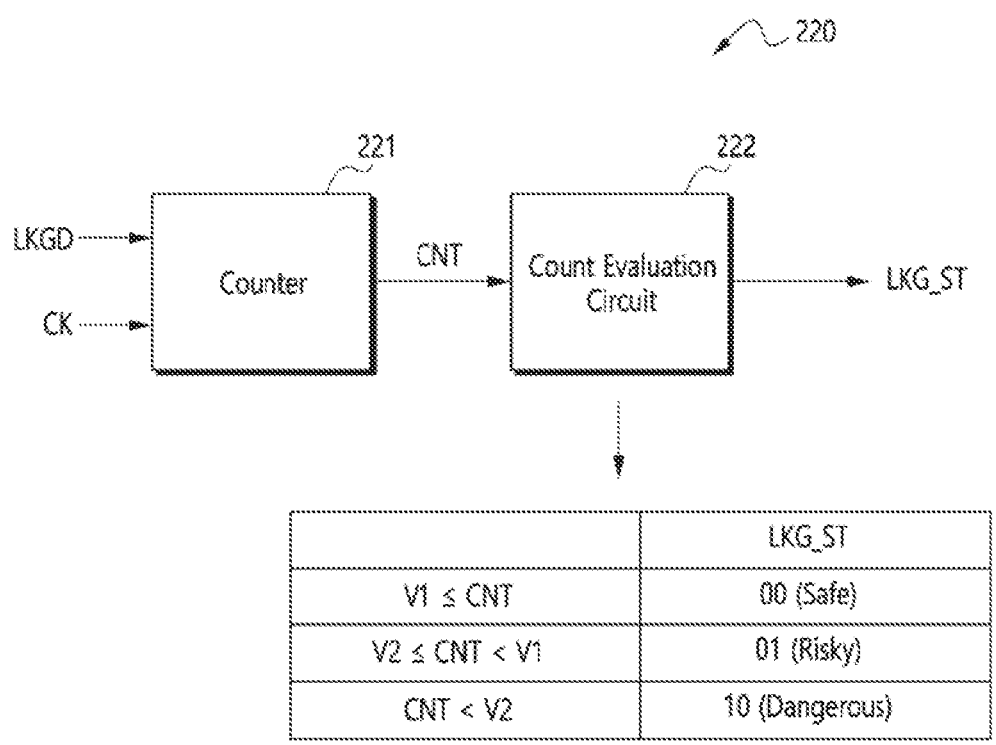
FIG. 4 is a block diagram illustrating a detailed configuration of a state decision circuit of FIG. 1 in accordance with an embodiment.

FIG. 4 is a block diagram illustrating a detailed configuration of the state decision circuit 220 of FIG. 1 in accordance with an embodiment.

Referring to FIG. 4, the state decision circuit 220 may include a counter 221 and a count evaluation circuit 222.

The counter 221 may output a count value CNT based on the detection signal LKGD that is output from the comparison circuit 210 and a clock signal CK that is output from the control circuit 110. The counter 221 may output the count value CNT by counting the number of pulses of the clock signal CK in the determination period based on the detection signal LKGD. In other words, the counter 221 may count the number of pulses of the dock signal CK while the detection signal LKGD is at the first logic level (e.g. logic high level) and may output the count value CNT. In an embodiment, based on the detection signal LKGD, the counter 221 may count the number of rising edges of the clock signal CK in the determination period and may output the count value CNT. In an embodiment, based on the detection signal LKGD, the counter 221 may count the number of falling edges of the dock signal CK in the determination period and output the count value CNT.

In an embodiment, the control circuit 110 may transmit the dock signal CK to the counter 221 from the start of the determination period.

The count evaluation circuit 222 may output the leakage state information LKG_ST based on one or more reference values and the count value CNT that is output from the counter 221. The one or more reference values may define two or more state regions that correspond to different leakage state values, respectively. The count evaluation circuit 222 may determine which state region the count value CNT belongs to and output a leakage state value, among the leakage state values, corresponding to the state region, as the leakage state information LKG_ST.

For example, the count evaluation circuit 222 may compare the count value CNT to two reference values, i.e. a first reference value V1 and a second reference value V2, and output the leakage state information LKG_ST that corresponds to any one of three states, e.g. "safe", "risky" and "dangerous" states. When the count value CNT is equal to or greater than the first reference value V1, the count evaluation circuit 222 may output a leakage state value of "00", corresponding to the "safe" state, as the leakage state information LKG_ST, Furthermore, when the count value CNT is equal to or greater than the second reference value V2 and lower than the first reference value V1, the count evaluation circuit 222 may output a leakage state value of "01", corresponding to the "risky" state, as the leakage state information LKG_ST, Furthermore, when the count value CNT is lower than the second reference value V2, the count evaluation circuit 222 may output a leakage state value of "10", corresponding to the "dangerous" state, as the leakage state information LKG_ST. "Safe", "risky" and "dangerous" may each indicate the leakage state of a target memory block in which an internal operation is performed. The first reference value V1 and the second reference value V2 may be determined in advance through a test.

The values "00", "01" and "10" are merely examples. In an embodiment, the count evaluation circuit 222 may use different values. Furthermore, the three leakage states, i.e. "safe", "risky" and "dangerous" states, are only examples, and the count evaluation circuit 222 may identify a smaller or larger number of leakage states than the three leakage states. For example, when the number of the reference values is "i", the count evaluation circuit 222 may identify "i+1" leakage states.

In an embodiment, one or more reference values may be changed depending on the type of the operation voltage VOP when the leakage detection operation is performed. For example, one or more reference values, when the operation voltage VOP is the program voltage, may be different from one or more reference values, when the operation voltage VOP is the program verify voltage.

In an embodiment, the leakage state information LKG_ST may be stored in a separate region that is included in the nonvolatile memory device 100, e.g. a state register. In an embodiment, the count value CNT may be stored in a separate region, e.g. a state register. As will be described below, the control circuit 110 may output the leakage state information LKG_ST and/or the count value CNT to the controller based on the controller.

Figure 5:
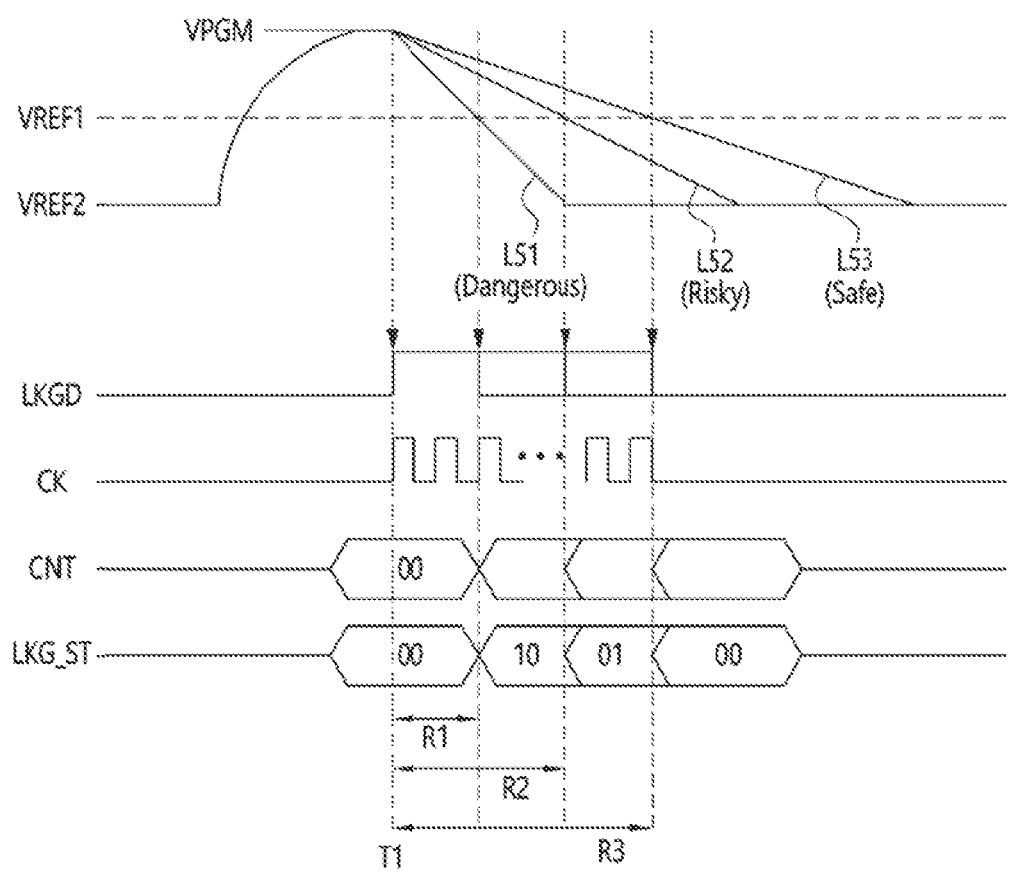
FIG. 5 is a timing diagram for describing an operation of a leakage detection circuit of FIG. 1 in accordance with an embodiment.

FIG. 5 is a timing diagram for describing an operation of the leakage detection circuit 200 of FIG. 1 in accordance with an embodiment.

Referring to FIGS. 1 and 3 to 5, based on the control circuit 110, the leakage detection circuit 200 may perform a leakage detection operation while an internal operation is being performed. First, the voltage supply circuit 120 may supply the operation voltage VOP, e.g. a program voltage VPGM, to the operation voltage node VN while the internal operation, e.g. a program operation, is being performed. Therefore, the first and second capacitors C1 and C2 may be charged, and the input voltage VREF2 of the input node VR2 may rise to the level of the program voltage VPGM. The comparison circuit 210 may output the detection signal LKGD at the second logic level, e.g. a logic low level. The state decision circuit 220 may output the initial values of the count value CNT and the leakage state information LKG_ST as "00", for example. Then, the voltage transfer path of the program voltage VPGM may be charged with the program voltage VPGM, and the voltage supply circuit 120 may be turned off at a time point T1.

After the voltage supply circuit 120 is turned off at the time point T1, the comparison circuit 210 may output the detection signal LKGD at the first logic level, e.g. a logic high level based on the control circuit 110. That is, the time point T1 may correspond to the start point of the determination period. The comparison circuit 210 may output the detection signal LKGD at a logic high level while the input voltage VREF2 is higher than the reference voltage VREF1. After the time point T1, the control circuit 110 may transmit the clock signal CK to the state decision circuit 220. The state decision circuit 220 may count pulses of the clock signal CK. Since the voltage supply circuit 120 was turned off, the input voltage VREF2 may gradually fall. The comparison circuit 210 may output the detection signal LKGD at a logic low level when the input voltage VREF2 becomes lower than the reference voltage VREF1, and the determination period may be ended, After the determination period is ended, the state decision circuit 220 may output the count value CNT and the leakage state information LKG_ST.

Specifically, when severe current leakage occurs from the voltage transfer path, the input voltage VREF2 may sharply fall as shown through line L51. In this case, the determination period R1 may be short, and the count value CNT that is acquired during the determination period R1 may be relatively small. For example, when the count value CNT is lower than the second reference value V2, "10" may be output as the leakage state information LKG_ST that corresponds to the dangerous state.

On the other hand, when almost no current leakage occurs from the voltage transfer path, the input voltage VREF2 may gently fall as shown through line L53. In this case, the determination period R3 may be long, and a count value CNT acquired during the determination period R3 may be relatively high. For example, when the count value CNT is equal to or greater than the first reference value V1, "00" may be output as the leakage state information LKG_ST that corresponds to the safe state.

Furthermore, when the input voltage VREF2 falls, as shown through line 52, the count value CNT that corresponds to the determination period R2 may be equal to or greater than the second reference value V2, and lower than the first reference value V1, and "01" may be output as the leakage state information LKG_ST that corresponds to the risky state.

Figure 6:
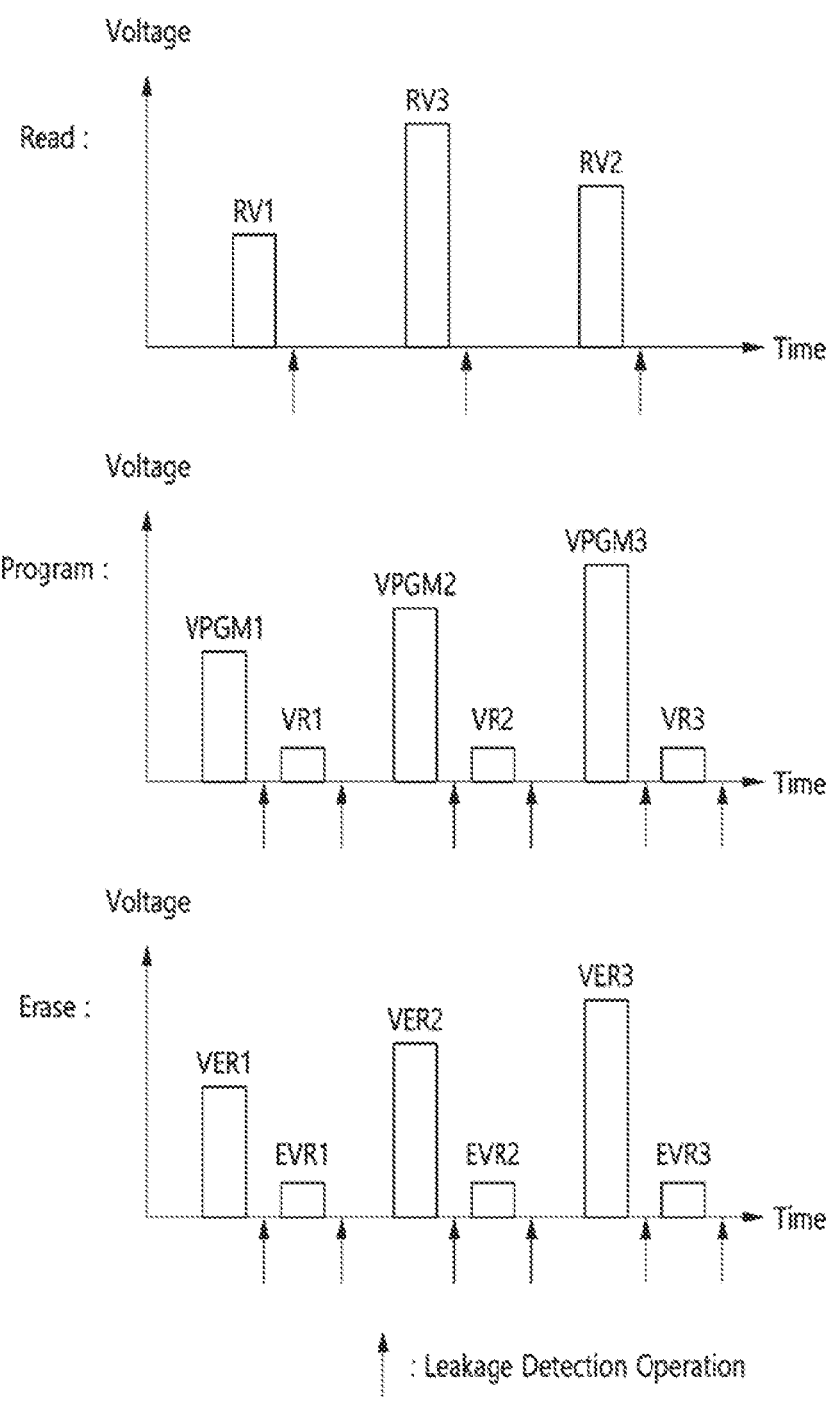
FIG. 6 is a diagram for describing a point of time that a leakage detection operation is performed in accordance with an embodiment.

FIG. 6 is a diagram for describing a point of time that the leakage detection operation in accordance with the present embodiment is performed.

Referring to FIG. 6, an external controller may determine the type of the operation voltage VOP at which the leakage detection circuit 200 is to perform the leakage detection operation. The leakage detection circuit 200 may perform the leakage detection operation on the selected type of the operation voltage VOP based on the controller.

In the case of the read operation, the nonvolatile memory device 100 may apply three read voltages RV1 to RV3 to a selected memory cell, for example. The leakage detection operation may be performed on one or more of the read voltages RV1 to RV3. In other words, the leakage detection circuit 200 may perform the leakage detection operation on a read voltage that is supplied to the operation voltage node VN.

In the case of a program operation, the nonvolatile memory device 100 may apply one or more program voltages VPGM and one or more program verify voltages, for example, and determine whether the program operation is a pass or fail. The nonvolatile memory device 100 may repeatedly apply one or more program voltages VPGM and one or more program verify voltages until the program operation is determined to be a pass. The leakage detection operation may be performed on one or more of program voltages VPGM1 to VPGM3 and program verify voltages VR1 to VR3.

In the case of an erase operation, the nonvolatile memory device 100 may apply one or more erase voltages and one or more erase verify voltages, for example, and determine whether the erase operation is a pass or fail. The nonvolatile memory device 100 may repeatedly apply one or more erase voltages and one or more erase verify voltages until the erase operation is determined to be a pass. The leakage detection operation may be performed on one or more of the erase voltages VER1 to VER3 and erase verify voltages EVR1 to EVR3.

Figure 7:
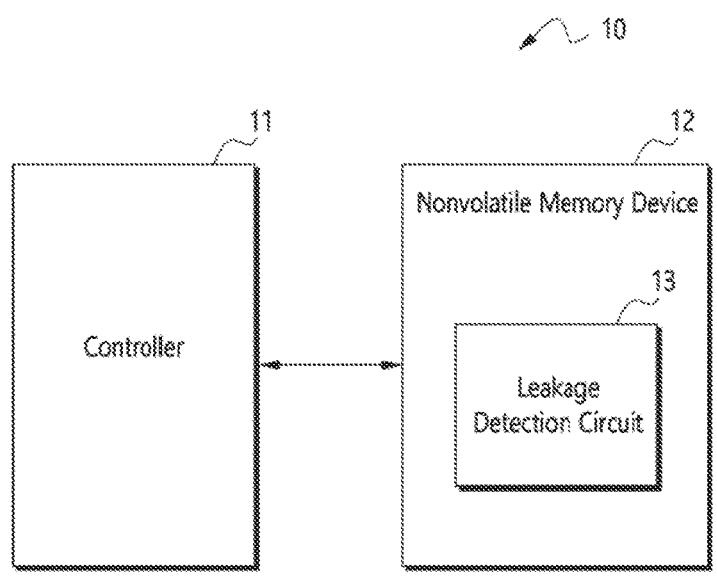
FIG. 7 is a block diagram illustrating a memory system in accordance with an embodiment.

FIG. 7 is a block diagram illustrating a memory system 10 in accordance with an embodiment.

Referring to FIG. 7, the memory system 10 may be configured to store data that is provided from an external host based on a write request of the host. Furthermore, the memory system 10 may be configured to provide data that is stored therein to the host, based on a read request of the host.

The memory system 10 may include a PCMCIA (Personal Computer Memory Card International Association) card, CF (Compact Flash) card, smart media card, memory stick, various multimedia cards (MMC, eMMC, RS-MMC and MMC-micro), SD (Secure Digital) card (SD, Mini-SD, Micro-SD), UFS (Universal Flash Storage), SSD (Solid State Drive) or the like.

The memory system 10 may include a controller 11 and a nonvolatile memory device 12.

The controller 11 may control overall operations of the memory system 10. The controller 11 may control the nonvolatile memory device 12 to perform a foreground operation according to an instruction of the host device. The foreground operation may include an operation of writing data to the nonvolatile memory device 12 or reading data from the nonvolatile memory device 12 according to an instruction of the host device, Le, a write or read request.

The controller 11 may control the nonvolatile memory device 12 to perform a background operation that is internally required independently of the host device. The background operation may include one or more of a wear-leveling operation, a garbage collection (GC) operation, an erase operation, a read reclaim operation, and a refresh operation on the nonvolatile memory device 12. The background operation may include an operation of writing data to the nonvolatile memory device 12 and reading data from the nonvolatile memory device 12, like the foreground operation.

The controller 11 may control the nonvolatile memory device 12 to perform a leakage detection operation while the nonvolatile memory device 12 performs an internal operation on a target memory block and may perform a memory management operation on the target memory block based on the performance result of the leakage detection operation.

In an embodiment, the controller 11 may determine whether to control the nonvolatile memory device 12 to perform the leakage detection operation based on an operation count for the nonvolatile memory device 12, e.g. an erase count, a program count, a read count, or the like. For example, when at least one of the erase count, the program count and the read count exceeds a threshold value, the controller 11 may control the nonvolatile memory device 12 to perform the leakage detection operation. That is, the controller 11 may control the nonvolatile memory device 12 to perform the leakage detection operation after the nonvolatile memory device 12 operates for a certain amount of time. The erase count, the program count, the read count and the like may be counts for the entire nonvolatile memory device 12. In an embodiment, the erase count, the program count, the read count, and the like may be counts for each of the memory blocks that are included in the nonvolatile memory device 12.

The controller 11 may determine the type of the operation voltage (VOP of FIG. 3) to which the leakage detection operation is to be performed. The type of the operation voltage VOP to which the leakage operation is to be performed may include one or more of the read voltage, the program voltage, the program verify voltage, the erase voltage, and the erase verify voltage. In an embodiment, the controller 11 may differently determine the reference voltage (VREF of FIG. 3) depending on the type of the operation voltage VOP to which the leakage detection operation is to be performed. In an embodiment, the controller 11 may differently determine one or more reference values (e.g. V1 and V2 of FIG. 4) depending on the type of the operation voltage VOP to which the leakage detection operation is to be performed.

The controller 11 may determine a point of time to perform a memory management operation on the target memory block based on the performance result of the leakage detection operation. In an embodiment, when the performance result of the leakage detection operation indicates a first leakage state, the controller 11 may perform a foreground GC operation on a target memory block and designate the target memory block as a bad block. When the performance result of the leakage detection operation indicates a second leakage state, the controller 11 may perform a background GC operation on the target memory block.

Based on the controller 11, the nonvolatile memory device 12 may store data that is transmitted from the controller 11, read data that is stored therein, and transmit the read data to the controller 11. The nonvolatile memory device 12 may include a plurality of memory blocks (not illustrated). Each of the memory blocks may correspond to the unit by which the nonvolatile memory device 12 performs an erase operation. Each of the memory blocks may include a plurality of memory regions. Each of the memory blocks may correspond to the unit by which the nonvolatile memory device 12 performs a program operation and a read operation.

The nonvolatile memory device 12 may include a flash memory device such as NAND flash or NOR flash, FeRAM (Ferroelectric Random Access Memory), PCRAM (Phase-Change Random Access Memory), MRAM (Magnetic Random Access Memory) or ReRAM (Resistive Random Access Memory).

The nonvolatile memory device 12 may include one or more planes, one or more memory chips, one or more memory dies or one or more memory packages.

FIG. 1 illustrates that the memory system 10 includes one nonvolatile memory device 12, but the number of nonvolatile memory devices included in the memory system 10 is not limited thereto.

The nonvolatile memory device 12 may include the nonvolatile memory device 100 of FIG. 1. The nonvolatile memory device 12 may include a leakage detection circuit 13. The leakage detection circuit 13 may be configured and operated in substantially the same manner as the leakage detection circuit 200 of FIG. 1.

Figure 8:
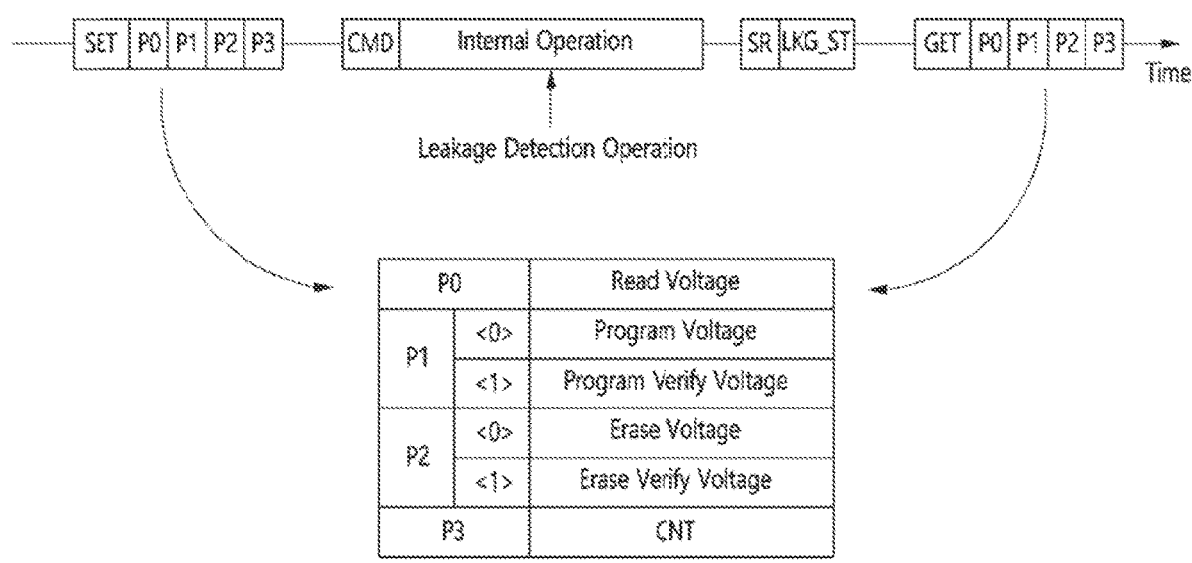
FIG. 8 is a diagram for describing a method for setting a leakage detection operation of a leakage detection circuit of FIG. 7 in accordance with an embodiment.

FIG. 8 is a diagram for describing a method for setting the leakage detection operation of the leakage detection circuit 13 of FIG. 7 in accordance with an embodiment.

Referring to FIG. 8, the controller 11 may set a detailed operation method of the leakage detection operation by using a predetermined command, e.g. a set feature command SET. In an embodiment, whenever controlling the internal operation of the nonvolatile memory device 12, the controller 11 may set the leakage detection operation through the set feature command SET. In an embodiment, the controller 11 may set the leakage detection operation through the set feature command SET, if necessary.

The controller 11 may transmit, to the nonvolatile memory device 12, setting information with first to fourth setting values P0 to P3 for the leakage detection operation with the set feature command SET. The first to third setting values P0 to P2 may each indicate the type of the operation voltage VOP to which the leakage detection operation is to be performed. The fourth setting value P3 might not be used for the set feature command SET. Therefore, when the first setting value P0, for example, is set in the set feature command SET, the nonvolatile memory device 12 may be set to perform the leakage detection operation on the read voltage.

Furthermore, the nonvolatile memory device 12 may perform an internal operation based on an internal operation command CMD of the controller 11, and perform the leakage detection operation in a preset manner while performing the internal operation. After performing the leakage detection operation, the nonvolatile memory device 12 may store the count value CNT and the leakage state information LKG_ST in a state register.

After the internal operation is completed, the controller 11 may acquire the leakage state information LKG_ST by using a predetermined command, e.g. a state read command SR. The nonvolatile memory device 12 may output the leakage state information LKG_ST to the controller 11 based on the state read command SR. The controller 11 may perform a memory management operation through the leakage state information LKG_ST, as will be described below.

The controller 11 may acquire the count value CNT by using a predetermined command, e.g., a get feature command GET. At this time, the nonvolatile memory device 12 may transmit setting information with the first to fourth setting values P0 to P3 to the controller 11 based on the get feature command GET. The fourth setting value P3 may include the count value CNT. The controller 11 may identify the leakage state of the target memory block through the count value CNT more specifically.

Figure 9:
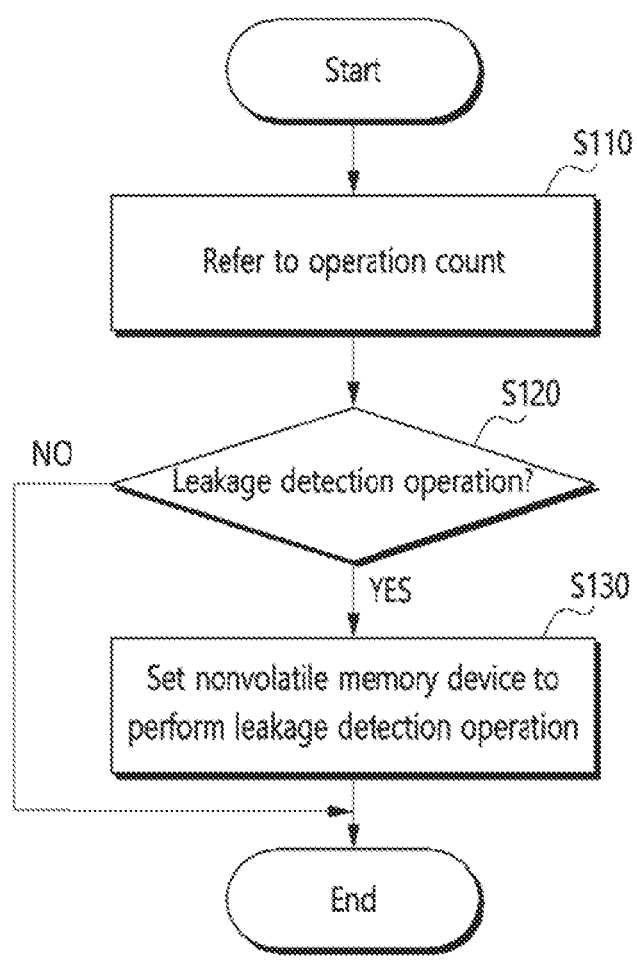
FIG. 9 is a flowchart for describing a method in which a controller controls a leakage detection operation of a nonvolatile memory device in accordance with an embodiment.

FIG. 9 is a flowchart for describing a method in which the controller 11 controls the leakage detection operation of the nonvolatile memory device 12 in accordance with an embodiment.

Referring to FIG. 9, the controller 11 may refer to the operation count in step S110. In an embodiment, the operation count may include one or more of an erase count, a program count and a read count. In an embodiment, the operation count may be a count for the target memory block on which the internal operation is to be performed. In an embodiment, the operation count may be a count for one or more memory blocks that are included in the nonvolatile memory device 12.

In step S120, based on the operation count, the controller 11 may determine whether to control the nonvolatile memory device 12 to perform the leakage detection operation. In an embodiment, when the operation count exceeds a predetermined threshold, the controller 11 may determine to control the nonvolatile memory device 12 to perform the leakage detection operation. When the controller 11 determines to control the nonvolatile memory device 12 to perform the leakage detection operation, the procedure may proceed to step S130. When the controller 11 determines to control the nonvolatile memory device 12 to not perform the leakage detection operation, the procedure may be ended.

In step S130, the controller 11 may set the nonvolatile memory device 12 to perform the leakage detection operation. As described with reference to FIG. 8, the controller 11 may set the nonvolatile memory device 12 to perform the leakage detection operation while performing the internal operation.

Figure 10:
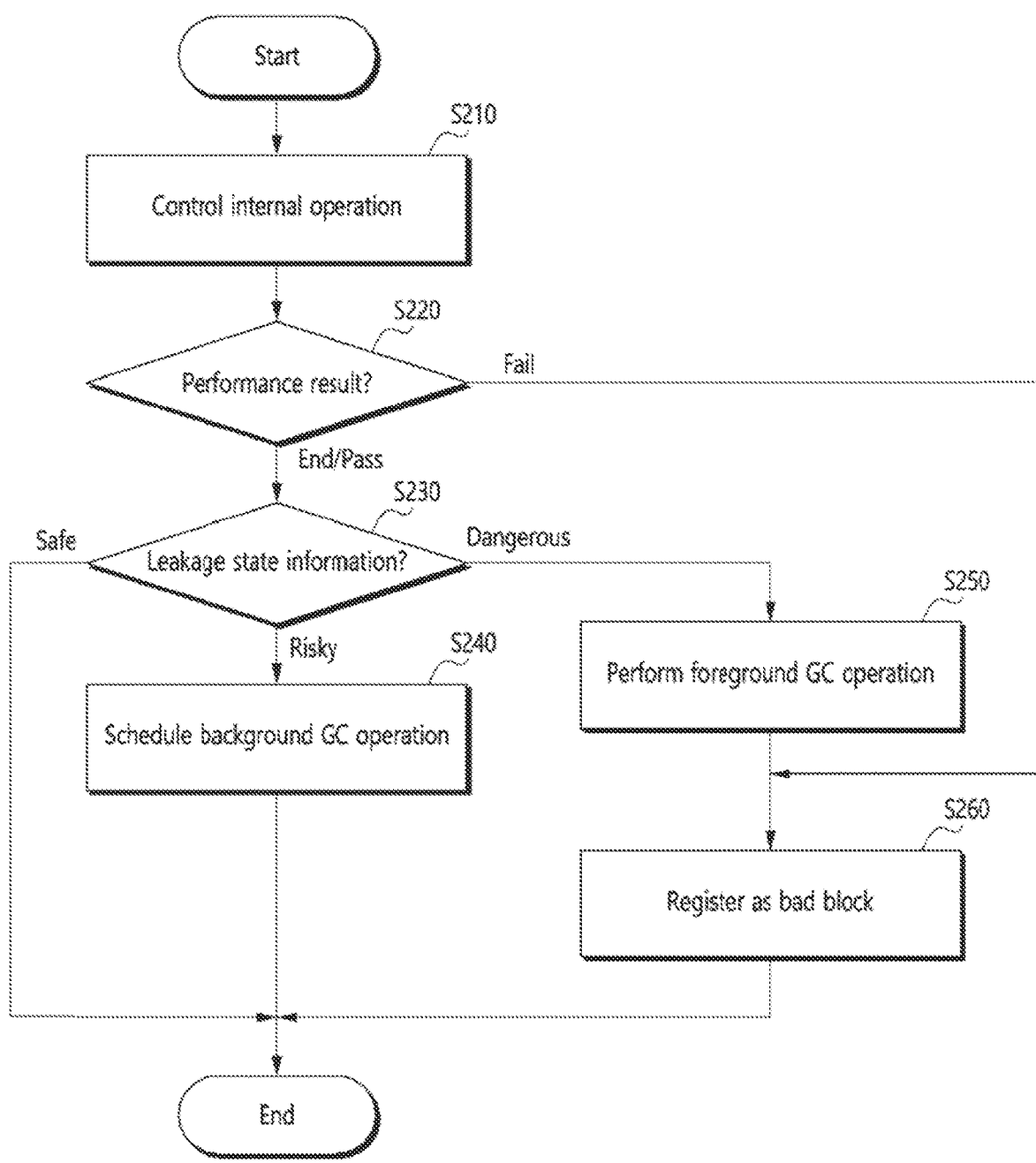
FIG. 10 is a flowchart for describing a method in which the controller performs a memory management operation based on leakage state information in accordance with an embodiment.

FIG. 10 is a flowchart for describing a method in which the controller 11 performs the memory management operation based on the leakage state information ILKG_ST in accordance with an embodiment. FIG. 10 is based on the assumption that the nonvolatile memory device 12 is set to perform the leakage detection operation, and the leakage state information LKG_ST indicates any one of three leakage states, i.e. safe, risky and dangerous states.

Referring to FIG. 10, the controller 11 may control the nonvolatile memory device 12 to perform an internal operation on a target memory block, in step S210. The internal operation may be any one of the read operation, the program operation, and the erase operation.

In step S220, the controller 11 may proceed according to the performance result of the internal operation of the nonvolatile memory device 12, In an embodiment, after the internal operation is completed, the controller 11 may acquire the performance result of the internal operation by using a predetermined command, e.g, the state read command SR. When the read operation ended or the program or erase operation passed, the procedure may proceed to step S230. When the program operation or the erase operation faded, the procedure may proceed to step S260.

In step S230, the controller 11 may proceed according to the leakage state information LKG_ST that is output from the nonvolatile memory device 12, After the internal operation is completed, the controller 11 may acquire the leakage state information LKG_ST by using a predetermined command, e.g. a state read command SR. When the leakage state information LKG_ST indicates the safe state, the procedure may be ended. When the leakage state information LKG_ST indicates the risky state, the procedure may proceed to step S240. When the leakage state information LKG_ST indicates the dangerous state, the procedure may proceed to step S250.

In step S240, the controller 11 may schedule a background GC operation on the target memory block on which the internal operation has been performed. The background GC operation may indicate a GC operation that is performed when the nonvolatile memory device 12 is in an idle state. That is, since the data reliability of the target memory block is not high, even though the internal operation for the target memory block was passed, the controller 11 may determine to perform the background GC operation on the target memory block in an idle state. When the background GC operation is performed, data that is stored in the target memory block may be migrated to another memory block.

In step S250, the controller 11 may perform a foreground GC operation on the target memory block on which the internal operation has been performed. The foreground GC operation may indicate a GC operation which is immediately performed even though the nonvolatile memory device 12 is not in an idle state. That is, since the data reliability of the target memory block is very low, even though the internal operation for the target memory block was passed, the controller 11 may determine to immediately perform the foreground GC operation on the target memory block. When the foreground GC operation is performed, the data that is stored in the target memory block may be migrated to another memory block.

In step S260, the controller 11 may register the target memory block as a bad block. That is, the controller 11 may register the target memory block as a bad block in order to forbid the target memory block from being used afterwards. When the procedure proceeds from step S260 to step S220, the controller 11 may register the target memory block as a bad block, regardless of the leakage state of the target memory block.

Figure 11:
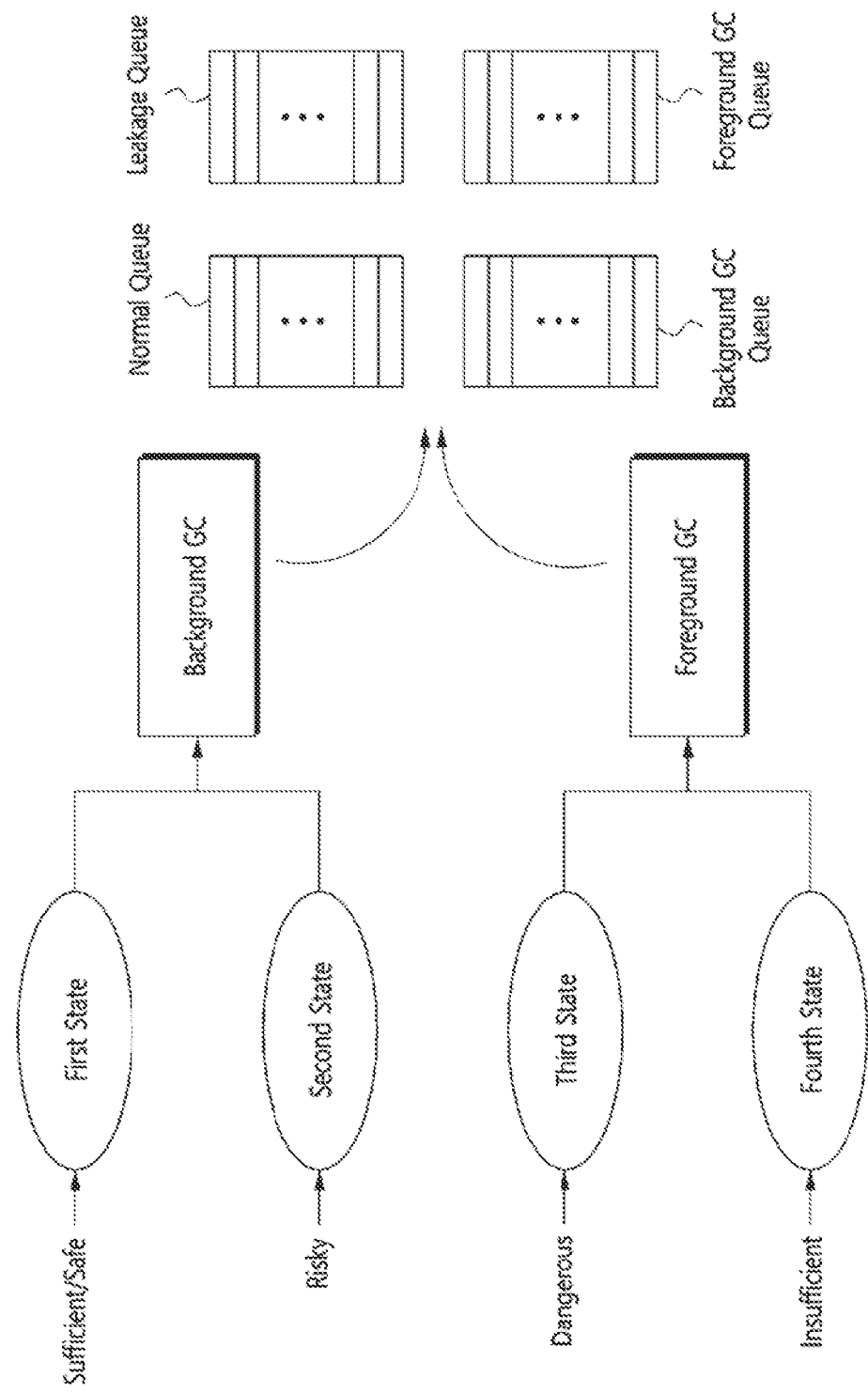
FIG. 11 is a diagram for describing a method in which the controller performs the memory management operation in accordance with an embodiment.

FIG. 11 is a diagram for describing a method in which the controller 11 performs the memory management operation in accordance with an embodiment.

Referring to FIG. 11, the controller 11 may determine the current state of the nonvolatile memory device 12 as any one of first to fourth states. The controller 11 may determine the current state of the nonvolatile memory device 12 by additionally considering the number of empty memory blocks that are included in the nonvolatile memory device 12 as well as the leakage state information LKG_ST.

Specifically, when a sufficient number of empty memory blocks are included in the nonvolatile memory device 12, the controller 11 may determine the state of the nonvolatile memory device 12 as the first state. The controller 11 may determine that a GC operation is required for a certain memory block for a predetermined reason (for example, by a wear-leveling operation or read reclaim operation), while the nonvolatile memory device 12 is in the first state. In this case, the controller 11 may schedule a GC operation for the corresponding memory block as the background GC operation. In an embodiment, the controller 11 may give a low priority to the background GC operation that is determined in the first state. Furthermore, when the leakage state information LKG_ST indicates the safe state, the controller 11 may determine the state of the nonvolatile memory device 12 as the first state.

Furthermore, when the leakage state information LKG_ST on the target memory block indicates the risky state, the controller 11 may determine the state of the nonvolatile memory device 12 as the second state. The controller 11 may schedule a GC operation for the target memory block as the background GC operation, based on the leakage state information LKG_ST. In an embodiment, the controller 11 may give a medium priority to the background GC operation that is determined in the second state. The background GC operation with the medium priority may be performed before the background GC operation with the low priority.

When the leakage state information LKG_ST on the target memory block indicates the dangerous state, the controller 11 may determine the state of the nonvolatile memory device 12 as the third state. The controller 11 may schedule a GC operation for the target memory block as the foreground GC operation, based on the leakage state information LKG_ST. In an embodiment, the controller 11 may give a high priority to the foreground GC operation that is determined in the third state. The foreground GC operation with the high priority may be performed before the background GC operations with the medium and low priorities.

When an insufficient number of empty memory blocks are included in the nonvolatile memory device 12, the controller 11 may determine the state of the nonvolatile memory device 12 as the fourth state. The controller 11 may determine that a GC operation is required for a certain memory block for a predetermined reason (for example, by a wear-leveling operation or read reclaim operation), while the nonvolatile memory device 12 is in the fourth state. In this case, the controller 11 may schedule a GC operation for the corresponding memory block as the foreground GC operation. In an embodiment, the controller 11 may give a high priority to the foreground GC operation that is determined in the fourth state.

In an embodiment, the controller 11 may manage a normal queue and a leakage queue. The normal queue may include information on the GC operations that are determined in the first and fourth states. The leakage queue may include information on the GC operations that are determined in the second and third states. The controller 11 may perform the GC operations according to the priorities, based on information queued in the normal queue and the leakage queue.

In an embodiment, the controller 11 may manage a background GC queue and a foreground GC queue. The background GC queue may include information on the GC operations that are determined in the first and second states. The foreground GC queue may include information on the GC operations that are determined in the third and fourth states. The controller 11 may perform the GC operations according to the priorities based on the information that is queued in the background GC queue and the foreground GC queue.

Figure 12:
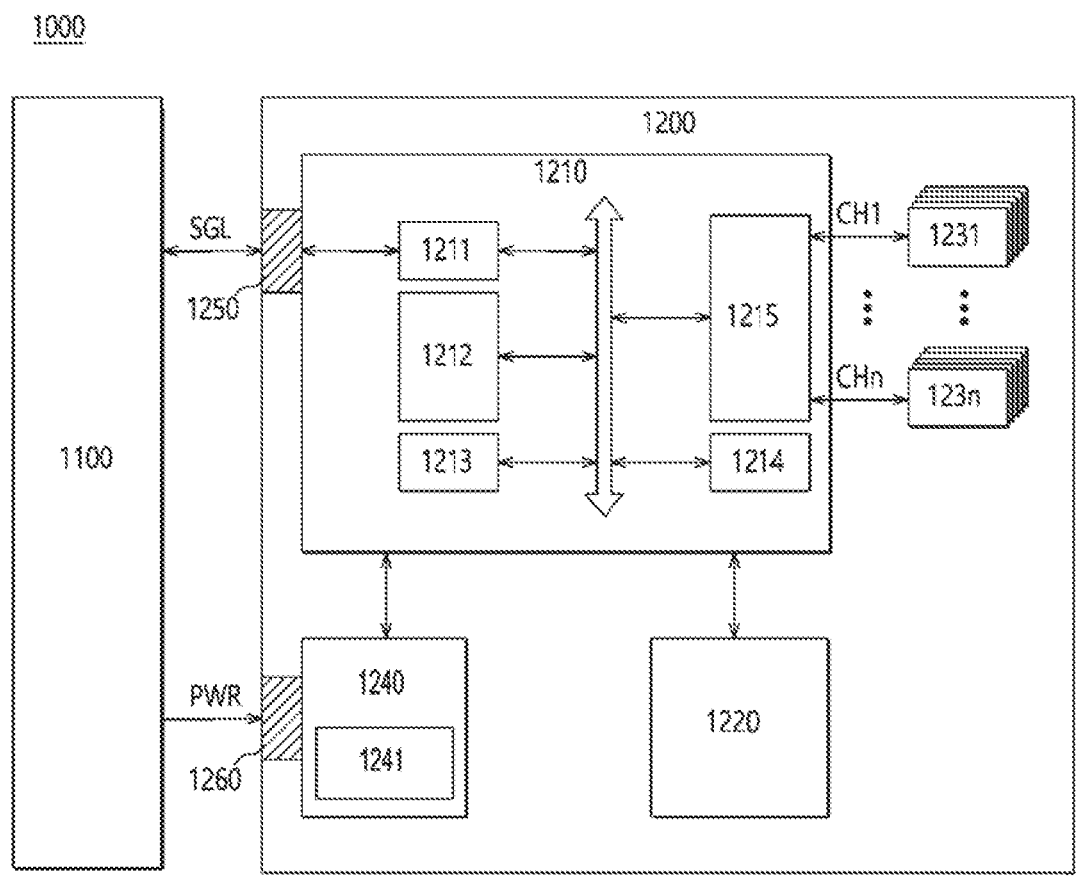
FIG. 12 is a diagram illustrating a data processing to system including a solid state drive (SSD) in accordance with an embodiment.

FIG. 12 is a diagram illustrating a data processing system 1000 with a solid state drive (SSD) 1200 in accordance with an embodiment. Referring to FIG. 12, the data processing system 1000 may include a host device 1100 and the SSD 1200.

The SSD 1200 may include a controller 1210, a buffer memory device 1220, a plurality of nonvolatile memory devices 1231 to 1203n, a power supply 1240, a signal connector 1250, and a power connector 1260.

The controller 1210 may control the general operations of the SSD 1200. The controller 1210 may include a host interface unit 1211, a control unit 1212, a random access memory 1213, an error correction code (ECC) unit 1214, and a memory interface unit 1215.

The host interface unit 1211 may exchange a signal SGL with the host device 1100 through the signal connector 1250. The signal SGL may include a command, an address, data, and so forth. The host interface unit 1211 may interface the host device 1100 and the SSD 1200 according to the protocol of the host device 1100. For example, the host interface unit 1211 may communicate with the host device 1100 through any one of standard interface protocols, such as secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnect (PCI), PCI express (PCI-E) and universal flash storage (UFS).

The control unit 1212 may analyze and process the signal SGL that is received from the host device 1100. The control unit 1212 may control operations of internal function blocks according to a firmware or a software for driving the SSD 1200. The random access memory 1213 may be used as a working memory for driving such a firmware or software.

The ECC unit 1214 may generate the parity data of data to be transmitted to at least one of the nonvolatile memory devices 1231 to 123n. The generated parity data may be stored together with the data in the nonvolatile memory devices 1231 to 123n. The ECC unit 1214 may detect an error of the data that is read from at least one of the nonvolatile memory devices 1231 to 123n, based on the parity data. If a detected error is within a correctable range, the ECC unit 1214 may correct the detected error.

The memory interface unit 1215 may provide control signals, such as commands and addresses, to at least one of the nonvolatile memory devices 1231 to 123*n*, according to control of the control unit 1212. Moreover, the memory interface unit 1215 may exchange data with at least one of the nonvolatile memory devices 1231 to 123*n*, according to control of the control unit 1212. For example, the memory interface unit 1215 may provide the data that is stored in the buffer memory device 1220, to at least one of the nonvolatile memory devices 1231 to 123*n*, or provide the data that is read from at least one of the nonvolatile memory devices 1231 to 123*n*, to the buffer memory device 1220.

The buffer memory device 1220 may temporarily store data to be stored in at least one of the nonvolatile memory devices 1231 to 123*n*. Further, the buffer memory device 1220 may temporarily store the data that is read from at least one of the nonvolatile memory devices 1231 to 123*n*. The data temporarily stored in the buffer memory device 1220 may be transmitted to the host device 1100 or at least one of the nonvolatile memory devices 1231 to 123*n* based on the controller 1210.

The nonvolatile memory devices 1231 to 123*n* may be used as storage media of the SSD 1200. The nonvolatile memory devices 1231 to 123*n* may be coupled with the controller 1210 through a plurality of channels CH1 to Chn, respectively. One or more nonvolatile memory devices may be coupled to one channel. The nonvolatile memory devices that are coupled to each channel may be coupled to the same signal bus and data bus.

The power supply 1240 may provide power PWR, input through the power connector 1260, to the interior of the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacity capacitors.

The signal connector 1250 may be configured by various types of connectors depending on an interface scheme between the host device 1100 and the SSD 1200.

The power connector 1260 may be configured by various types of connectors depending on a power supply scheme of the host device 1100.

Figure 13:
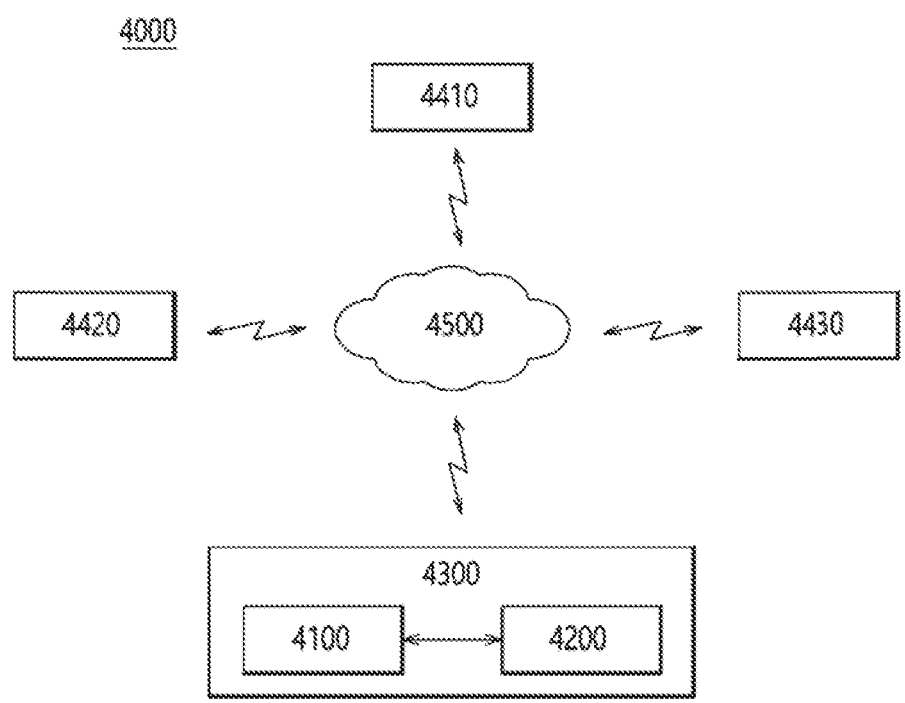
FIG. 13 is a diagram illustrating a network system including a memory system in accordance with an embodiment.

FIG. 13 is a diagram illustrating a network system 4000 including a memory system 4200 in accordance with an embodiment, Referring to FIG. 13, the network system 4000 may include a server system 4300 and a plurality of client systems 4410 to 4430 which are coupled through a network 4500.

The server system 4300 may service data based on requests from the plurality of client systems 4410 to 4430. For example, the server system 4300 may store the data that is provided from the plurality of client systems 4410 to 4430. For another example, the server system 4300 may provide data to the plurality of client systems 4410 to 4430.

The server system 4300 may include a host device 4100 and the memory system 4200. The memory system 4200 may be configured by the memory system 10 shown in FIG. 7 or the SSD 1200 shown in FIG. 12.

While various embodiments have been described above, it will be understood to those skilled in the art that the embodiments described are examples only. Accordingly, the leakage detection circuit, the nonvolatile memory device and the memory system, which are described herein, should not be limited based on the described embodiments.

What is claimed is:

1. A leakage detection circuit comprising:
   a comparison circuit configured to compare an input voltage, which changes based on the level of an operation voltage node, to a reference voltage and configured to output a detection signal; and
   a state decision circuit configured to identify a determination period during which the detection signal has a first logic level, configured to determine a count value corresponding to a length of the determination period that is shorter as an amount of current leakage is greater, configured to compare the count value to multiple reference values, and configured to output leakage state information indicating one of at least three of leakage states based on a comparison result.

2. The leakage detection circuit according to claim 1, wherein the comparison circuit is configured to output the detection signal that has the first logic level in the determination period and has a second logic level in the other periods, and
   wherein the determination period starts when the supply of an operation voltage to the operation voltage node is removed and ends when the input voltage becomes lower than the reference voltage.

3. The leakage detection circuit according to claim 1, wherein the state decision circuit comprises:
   a counter configured to output the count value based on the detection signal and a clock signal; and
   a count evaluation circuit configured to compare the count value to the reference values and configured to output the leakage state information.

4. The leakage detection circuit according to claim 3, wherein, based on the detection signal, the counter counts the number of pulses of the clock signal in the determination period and outputs the count value.

5. The leakage detection circuit according to claim 3, wherein the reference values define state regions that correspond to different leakage state values, respectively, and
   wherein the count evaluation circuit determines which state region, among the state regions, the count value belongs to and outputs a leakage state value, among the leakage state values, corresponding to the state region, as the leakage state information.

6. A nonvolatile memory device comprising:
   a voltage supply circuit configured to supply an operation voltage while an internal operation is being performed;
   a leakage detection circuit configured to perform a leakage detection operation by comparing a count value to multiple reference values, the count value being inversely proportional to an amount of current leakage from a voltage transfer path of the operation voltage; and
   a control circuit configured to control the leakage detection operation.

7. The nonvolatile memory device according to claim 6, wherein the control circuit determines the type of the operation voltage based on an external controller.

8. The nonvolatile memory device according to claim 7, wherein the type of the operation voltage comprises one or more of a read voltage, a program voltage, a program verify voltage, an erase voltage, and an erase verify voltage.

9. The nonvolatile memory device according to claim 6, wherein the leakage detection circuit comprises:
   a comparison circuit, coupled to an operation voltage node to which the operation voltage is supplied from the voltage supply circuit, configured to compare an input voltage, which changes based on the level of the operation voltage node, to a reference voltage and configured to output a detection signal; and a state decision circuit configured to configured to identify a determination period during which the detection signal has a first logic level, determine the count value corresponding to a length of the determination period that is shorter as the amount of current leakage is greater, configured to compare the count value to the reference values, and configured to output leakage state information indicating one of at least three of leakage states based on a comparison result.

10. The nonvolatile memory device according to claim 9, wherein the control circuit sets the reference voltage according to the type of the operation voltage.

11. The nonvolatile memory device according to claim 9, wherein the comparison circuit is configured to output the detection signal that has the first logic level in the determination period and has a second logic level in the other periods, and wherein the determination period starts when the voltage supply circuit is turned off and ends when the input voltage becomes lower than the reference voltage.

12. The nonvolatile memory device according to claim 9, wherein the state decision circuit comprises:

a counter configured to output the count value based on the detection signal and a clock signal; and a count evaluation circuit configured to compare the count value and the reference values and configured to output the leakage state information.

13. The nonvolatile memory device of claim 12, wherein the control circuit sets the reference values according to the type of the operation voltage.

14. A memory system comprising:

a nonvolatile memory device configured to perform a leakage detection operation while performing an internal operation on a target memory block; and a controller configured to count a number of times the operation has been performed on the target memory block as an operation count, configured to activate the leakage detection operation when the operation count exceeds a threshold value, and configured to perform a memory management operation on the target memory block based on a performance result of the leakage detection operation.

15. The memory system according to claim 14, wherein the controller determines a point of time to perform the memory management operation on the target memory block based on the performance result.

16. The memory system according to claim 14, wherein, when the performance result indicates a first leakage state of at least three of leakage states, the controller performs a foreground garbage collection operation on the target memory block and designates the target memory block as a bad block.

17. The memory system according to claim 14, wherein, when the performance result indicates a second leakage state of at least three of leakage states, the controller performs a background garbage collection operation on the target memory block.

18. The memory system according to claim 14, wherein the controller determines the type of an operation voltage to which the leakage detection operation is to be performed.

19. The memory system according to claim 14, wherein the nonvolatile memory device comprises a leakage detection circuit configured to generate a detection signal by comparing an input voltage, which changes based on the level of an operation voltage node, to a reference voltage, while performing the internal operation, and configured to perform the leakage detection operation by counting a predetermined period of the detection signal.

* * * * *